US008163094B1

(12) United States Patent
Greer et al.

(10) Patent No.: US 8,163,094 B1
(45) Date of Patent: Apr. 24, 2012

(54) METHOD TO IMPROVE INDIUM BUMP BONDING VIA INDIUM OXIDE REMOVAL USING A MULTI-STEP PLASMA PROCESS

(75) Inventors: H. Frank Greer, Pasadena, CA (US);
Todd J. Jones, Altadena, CA (US);
Richard P. Vasquez, Altadena, CA (US);
Michael E. Hoenk, Valencia, CA (US);
Matthew R. Dickie, Altadena, CA (US);
Shouleh Nikzad, Valencia, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 389 days.

(21) Appl. No.: 12/508,006

(22) Filed: Jul. 23, 2009

(51) Int. Cl.
*B08B 6/00* (2006.01)
(52) U.S. Cl. ............. 134/1.2; 134/1.1; 134/26; 156/281
(58) Field of Classification Search .................. None
See application file for complete search history.

(56) References Cited

U.S. PATENT DOCUMENTS

| 4,865,245 | A | 9/1989 | Schulte et al. |
| 2002/0060380 | A1* | 5/2002 | Uner et al. ............... 264/483 |
| 2003/0019917 | A1 | 1/2003 | Furuno et al. |
| 2011/0011531 | A1* | 1/2011 | Schulte ................ 156/281 |

OTHER PUBLICATIONS

G. Humpston and D. M. Jacobson, Principles of soldering materials, Park, OH: ASM International, pp. 126-130 (2004).
I.Adesida et al., Etching of indium tin oxide in methane/hydrogen plasmas, J. Vac. Sci., Technology B, vol. 9, No. 6 (1991).
Saia et al., Selective reactive ion etching of indium-tin oxide in a hydrocarbon gas mixture, Jrnl of the Electrochemical Society, vol. 138:, No. 2, pp. 493 (1991).

* cited by examiner

*Primary Examiner* — Michael Kornakov
*Assistant Examiner* — Ryan Coleman
(74) *Attorney, Agent, or Firm* — Mark Homer

(57) ABSTRACT

A process for removing indium oxide from indium bumps in a flip-chip structure to reduce contact resistance, by a multi-step plasma treatment. A first plasma treatment of the indium bumps with an argon, methane and hydrogen plasma reduces indium oxide, and a second plasma treatment with an argon and hydrogen plasma removes residual organics. The multi-step plasma process for removing indium oxide from the indium bumps is more effective in reducing the oxide, and yet does not require the use of halogens, does not change the bump morphology, does not attack the bond pad material or under-bump metallization layers, and creates no new mechanisms for open circuits.

9 Claims, 7 Drawing Sheets

METHOD TO IMPROVE INDIUM BUMP BONDING VIA INDIUM OXIDE REMOVAL USING A MULTI-STEP PLASMA PROCESS

STATEMENT OF GOVERNMENT INTEREST

The invention described hereunder was made in the performance of work under a NASA contract, and is subject to the provisions of Public Law #96-517 (35 U.S.C. 202) in which the Contractor has elected not to retain title.

BACKGROUND a. Field of Invention

The invention relates to electronic device fabrication processes and, more particularly to a process for removing indium oxide from indium bumps used in flip chip hybridization ("bump bonding").

b. Background of the Invention

Flip chip hybridization, also known as bump bonding or Controlled Collapse Chip Connection (C4), is an efficient method for connecting semiconductor devices using solder bumps deposited onto their contact pads. The semiconductor device is fabricated by forming integrated circuit(s) on a wafer. Contact pads are then metalized on the surface of the ICs, and solder dots or "bumps" are deposited on each of the pads. The ICs are then cut from the wafer to form "chips". The chips are flipped and positioned so that the solder bumps are facing connectors on external circuitry. The solder bumps are then re-melted (typically using hot air) to complete the connections. This eliminates the need for wire bonding in which the chip is mounted upright and wires are used to interconnect the chip pads to external circuitry. This approach is particularly well-suited for flight applications as it significantly reduces the dimensions of the final device.

FIG. 1 is a front perspective view of solder bumps. The solder bumps are composed of indium metal deposited by thermal evaporation onto the pads. Indium bump technology has been a part of the electronic interconnect process field for many years. However, obtaining a reliable, high yield process for high density patterns of bumps can be quite difficult. One problem, in particular, is the tendency of the indium bumps to oxidize during exposure to air. The length of air exposure may vary during fabrication, and so there can be a great deal of variability in the amount of oxidation. As the level of oxidation increases, the contact resistance of the solder joint between the two halves of the flip-chip structure also increases, to the point where the bump may act as an open circuit preventing the assembled device from functioning correctly. Therefore, it is useful to have a reliable process that can remove this oxidized layer.

Several publications and patents have described methods where aqueous acidic solutions (e.g. HCl) have been used to etch away the indium oxide, leaving indium metal behind. See. For example, U.S. Pat. No. 4,865,245 to Schulte et al. issued Sep. 12, 1989, where devices are etched to remove oxide from the contact bumps and to prevent subsequent oxidation. Unfortunately, this approach is somewhat limited. Once the oxide is removed, HCl can continue to attack the indium, reducing the size of the bump. In addition, wet chemical processes are isotropic, meaning that they will attack the bump from all sides. This process can cause the bumps to be undercut.

FIG. 2 is a front perspective view of indium bumps of FIG. 1 after dipping in HCl. It is apparent in comparing FIGS. 1 and 2, severe corrosion (a) and undercut (b) is observed for the HCl treated bump of FIG. 2. Note that corrosion (a) and undercut (b) is only evident on indium bumps resting on an under-bump metallization (UBM) Ti/Pt metal bilayer (c). This undercutting results in a lack of mechanical stability prior to bonding. HCl can also attack the bond pad material, or under bump metallization layers (c), which, ironically, can create a new mechanism for open circuit conditions "opens" that the acidic treatment was meant to eliminate.

An ideal process for removing indium oxide from the indium bumps would reduce the oxide without attacking the indium metal. It is known that the use of a gas will not attack the indium metal, and toward this end hydrogen gas has been attempted.

FIG. 3 is a plot of the oxide reduction rates for various oxides when exposed to molecular hydrogen, as a function of temperature (degrees C.). The reduction rate (y-axis) is represented as decreasing thickness (nm) per minute. See, G. Humpston and D. M. Jacobson, *Principles of Soldering Materials*, Park, Ohio: ASM International, pp. 126-130 (2004). Unfortunately, from the center graph it can be seen that the reduction of indium oxide to indium metal in molecular hydrogen requires temperatures in excess of 380 degrees C. to achieve a reasonable reaction rate. These high temperatures are often not compatible with the types of devices that are typically hybridized.

The prior art suggests that indium tin oxide (ITO) can be etched selectively using CH4/H2 plasmas. See, I. Adesida et al., *Etching Of Indium Tin Oxide In Methane/Hydrogen Plasmas*, J. Vac. Sci. Technology B., Vol. 9, No. 6 (1991). This is due to the tendency of the oxygen in the ITO to form volatile COx species, with indium metal forming a volatile organometallic compound, In(CH3)3. Saia et al., *Selective Reactive Ion Etching Of Indium-Tin Oxide In A Hydrocarbon Gas Mixture*, J. Electrochemical Soc., vol. 138, no 2, pp. 493 (1991).

United States Patent Application 20030019917 by Furuno et al. published Jan. 30, 2003 teaches that atomic hydrogen generated in a plasma can be a potential alternative to molecular hydrogen due to its greater reactivity. However, a single-step plasma-based hydrogen process for removing indium oxide from the indium bumps as disclosed does not completely reduce the oxide. It would be greatly advantageous to provide a multi-step process for removing indium oxide from the indium bumps that is more effective in reducing the oxide, and yet does not require the use of halogens, does not change the bump morphology, does not attack the bond pad material or under-bump metallization layers, and creates no new mechanisms for open circuits.

SUMMARY OF THE INVENTION

According to the present invention, the above-described and other objects are accomplished by providing a unique multi-step plasma process to remove indium oxide from indium bumps. The process does not require the use of halogens, does not change the bump morphology, and shows an improvement over a single step plasma based hydrogen treatment.

DETAILED DESCRIPTION OF THE PREFERRED EMBODIMENT

Figure 1:
FIG. 1 is a front perspective view of indium bumps before dipping in HCl.
Figure 2:
FIG. 2 is a front perspective view of indium bumps as in FIG. 1 after dipping in HCl.
Figure 3:
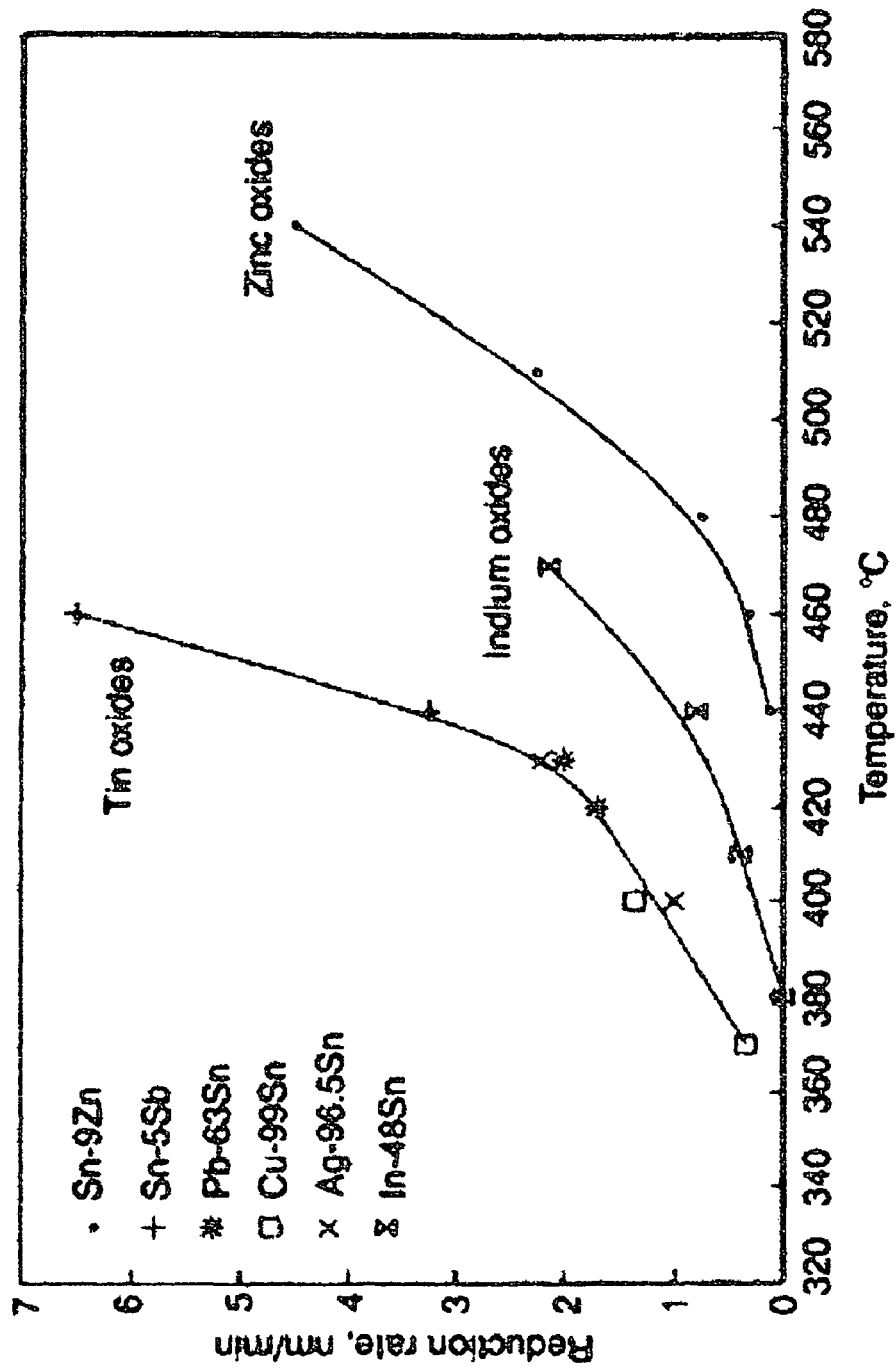
FIG. 3 is a plot of the oxide reduction rates (decreasing thickness in nm-per-minute) for various oxides when exposed to molecular hydrogen, as a function of temperature (degrees C.)

Bump bonding uses indium bumps to directly connect a semiconductor IC to another structure or substrate face down eliminating the need for wire bonding. However, if the indium bumps become oxidized prior to bump bonding a treatment is needed to remove the oxide in order to reduce the contact resistance of the solder joint between the two halves of the flip-chip structure. The present invention is a multi-step plasma process to remove indium oxide from indium bumps which does not require the use of halogens, does not change the bump morphology, and which exhibits increased removal effectiveness over a single step plasma based hydrogen treatment.

The process is intended for use on a semiconductor device having integrated circuit(s) and contact pads metalized on the surface of the device, and indium solder dots or bumps deposited on each of the pads by any conventional deposition process. Although the method of the present invention may be used with solder bumps formed by any conventional deposition process, a preferred process entails the following steps:

1. spin photoresist for the under bump metallization (UBM) pattern onto the pad side of the device;
2. soft bake the photoresist;
3. align the coated device to a UBM overlay mask and expose to UV light;
4. develop the photoresist to reveal the UBM pattern;
5. sputter clean exposed pads and deposit UBM onto the patterned device;
6. lift off the metal-coated photoresist to leave the UBM coated pads;
7. repeat a similar process sequence as steps 1-5 for indium instead of UBM to pattern indium bumps;
8. protect the indium bumps by spincoating a layer of photoresist to minimize oxidation.

More specifically, the preferred process begins at step 1 by coating the entire device with photoresist, and at step 2 by softbaking using a conventional hot plate or oven (e.g., convection, IR, hot plate) preferably at between 90-100 deg C. to vaporize solvent and improve adhesion of the photoresist. Once coated, at step 3 the device is aligned to a mask plate that defines the UBM pads. After the device is aligned, UV light is exposed through the maskplate onto the photosensitive resist, transferring the pattern of the overlay into the resist. At step 4 the photoresist is developed to reveal the UBM pattern. After patterning, at step 5 the device is loaded into a sputter deposition system, such as is available from AJA International, Inc., where the exposed patterned areas are ion cleaned and then coated with titanium and platinum. Once the device is removed from the sputter system, at step 0.6 it is placed in a solvent to remove the excess metallized photoresist. All that now remains of the metal coating are the defined pads on the device. An under bump metallurgy (UBM) structure is an important component of any solder interconnect system. The UBM typically provides three functions: adhesion to underlying dielectric and metal, barrier to protect the silicon circuitry, and a solder wettable surface. In this case the Ti layer serves as an adhesion layer, and the Pt layer as a diffusion-barrier layer.

After UBM deposition, at step 7 the patterning/metallization process is repeated using a different photomask in order to define the indium bumps on top of the UBM pads. The process is similar to patterning UBM, except that the device is loaded into a thermal evaporator instead of a sputtering system, and indium is deposited instead of Ti/Pt.

Immediately after lift-off of the indium-coated photoresist, at step 8 the indium bumps should be protected by spin coating a layer of photoresist to minimize oxidation. Obviously, there will be increased effectiveness of the present (or any) deoxidation process if there is less oxidation to remove. Just prior to bump bonding, the photoresist protected samples should be rinsed with acetone and then 2-propanol isopropyl alcohol (IPA) to dissolve the protective layer of photoresist, and finally blown dry with nitrogen. The samples may be purged with nitrogen.

Given solder bumps formed by the above-described or any other conventional deposition process, and before the semiconductor IC device is bump bonded, it is subjected to a multi-step plasma treatment in accordance with the present invention. The basic treatment involves two steps: first exposing the device to a plasma of argon, methane and hydrogen to reduce the indium oxide; and followed by an exposure to a plasma of Argon and hydrogen to remove residual organics. More specifically, the presently preferred two-step plasma treatment defines the critical process parameters of process pressure, plasma power, and process gas type, as follows:

Step 1: Plasma composition: 33% Ar/33% CH4/33% H2; Pressure=75 mTorr; Power=70 W.

Step 2: Plasma composition: 72% Ar/28% H2; Pressure=80 mTorr; Power=40 W.

The duration of each of these steps was fixed at 20 minutes and this duration was suitable for present purposes. Somewhat longer or shorter processing times may be equally well-suited. In industry, forty minutes would be deemed unacceptable, and so there is a commercial desire to reduce the processing times. The present inventors made no attempt to optimize the processing step times, but with optimization these times could readily be reduced by those skilled in the art.

The semiconductor IC samples may be plasma-treated in a dry box that is purged with nitrogen. A deionization fan was used in the dry box to prevent damage to the detector from electrostatic discharge. The dry box may be any suitable Nitrogen dry box such as a Plas Labs Dry Box with Shelf I, model 850-NB. The dry box is arranged to encompass the loading area of a plasma sterilizer such as a Plasmaster™ RME 1200 (from Belimed in Switzerland), equipped with a graphite discharge electrode (which has a greater reproducibility of plasma conditions for low power processes). Since the sputter yield of indium oxide is 40 times less than that of indium metal, it is extremely important to keep the voltage of the plasma low enough to avoid a significant reduction in bump height or change in morphology.

It is noteworthy that the present inventors attempted various combinations of inert gases (Ar and He) with hydrogen, and tested their capability to reduce indium oxide.

Figure 4:
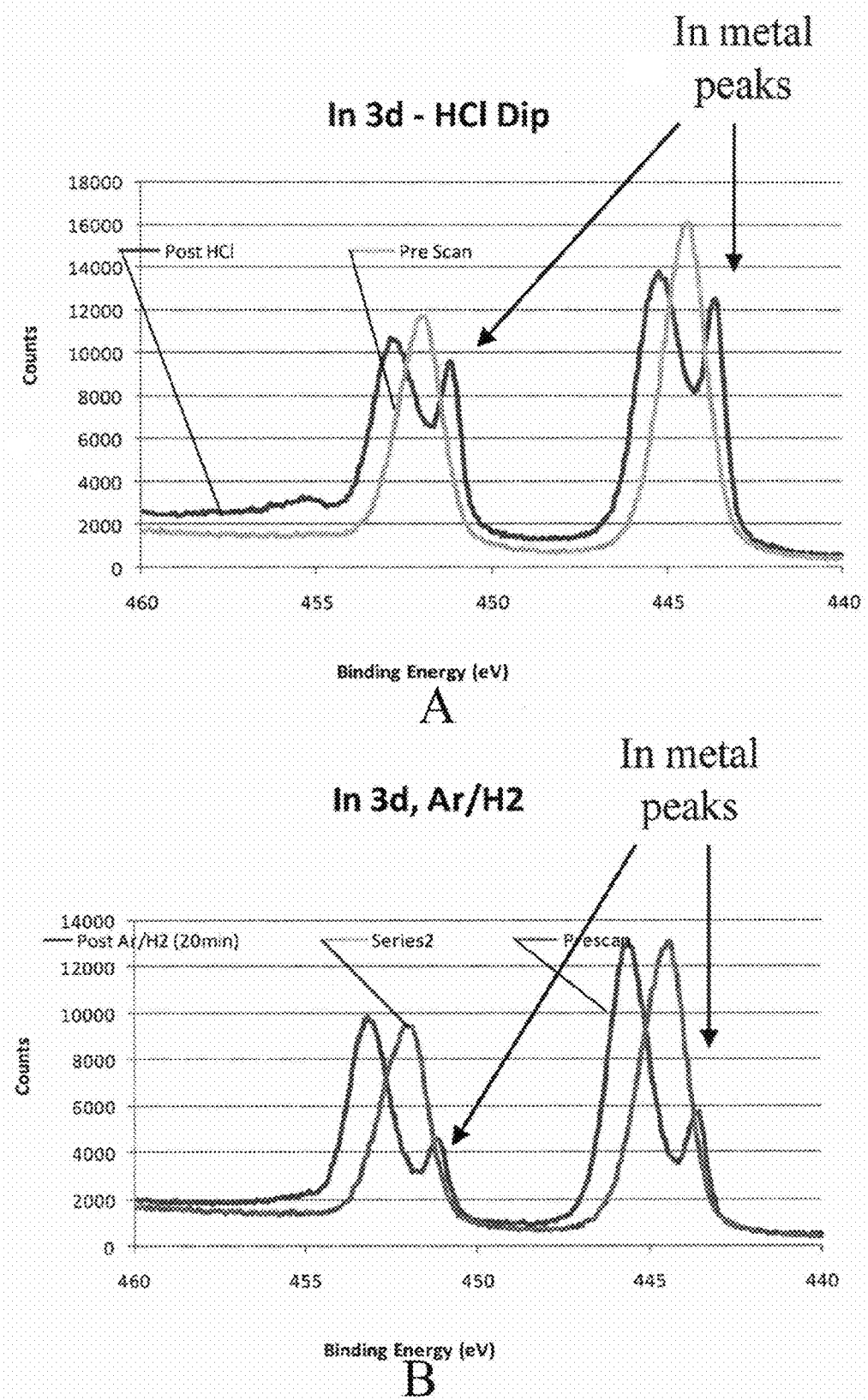
FIG. 4 is a composite graph of High resolution In 3D X-ray Photoelectron Spectroscopy (XPS) scans of indium shot samples (comparing an HCL dip at A to a 20 minute Ar/H2 plasma treatment at B)

FIG. 4 is a composite graph of High resolution In 3D X-ray Photoelectron Spectroscopy (XPS) scans of indium shot samples (comparing an HCL dip at A to a 20 minute Ar/H2 plasma treatment at B). Comparing FIG. 4(A) to 4(B), the high resolution 3d XPS scans show that the use of an Ar/H2 plasma is not as effective as an HCl dip in producing a strong indium metal peak after treatment. Instead, a methane CH4/H2 plasma will chemically etch indium oxide.

Figure 5:
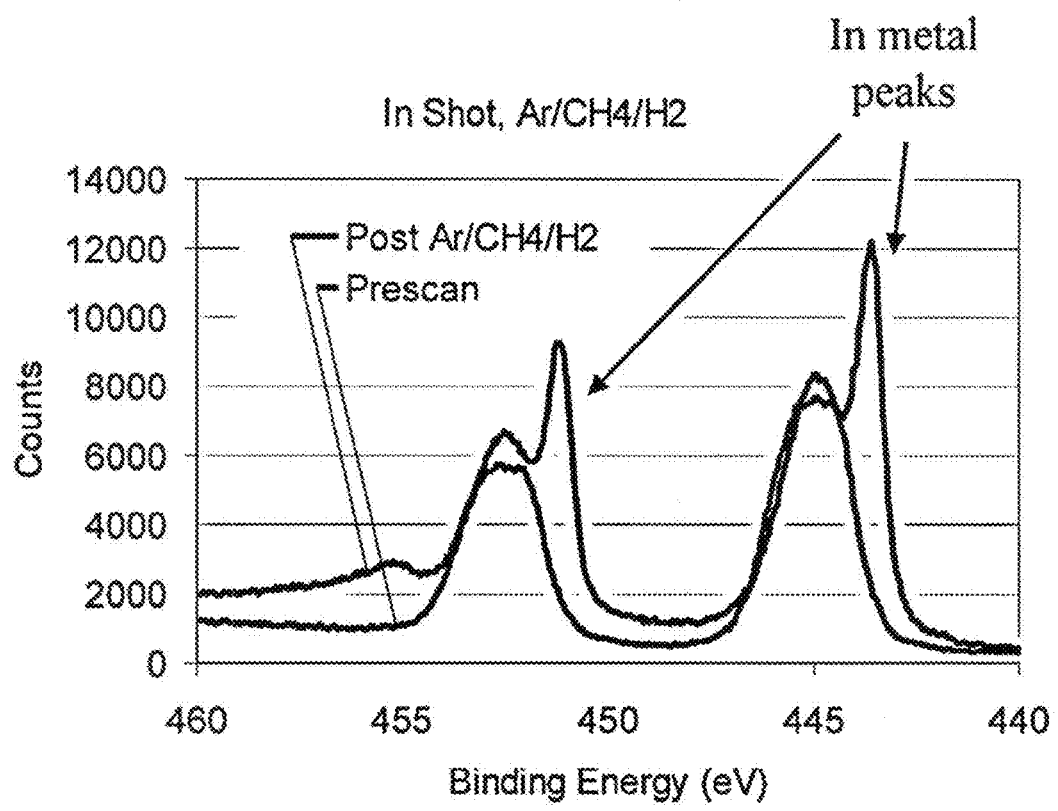
FIG. 5 is a composite graph of high resolution In 3d XPS scans of an indium shot sample, pre and post Ar/CH4/H2 plasma treatment.

This is confirmed in FIG. 5, which is a composite graph of high resolution In 3d XPS scans of an indium shot sample, pre and post Ar/CH4/H2 plasma treatment.

Figure 6:
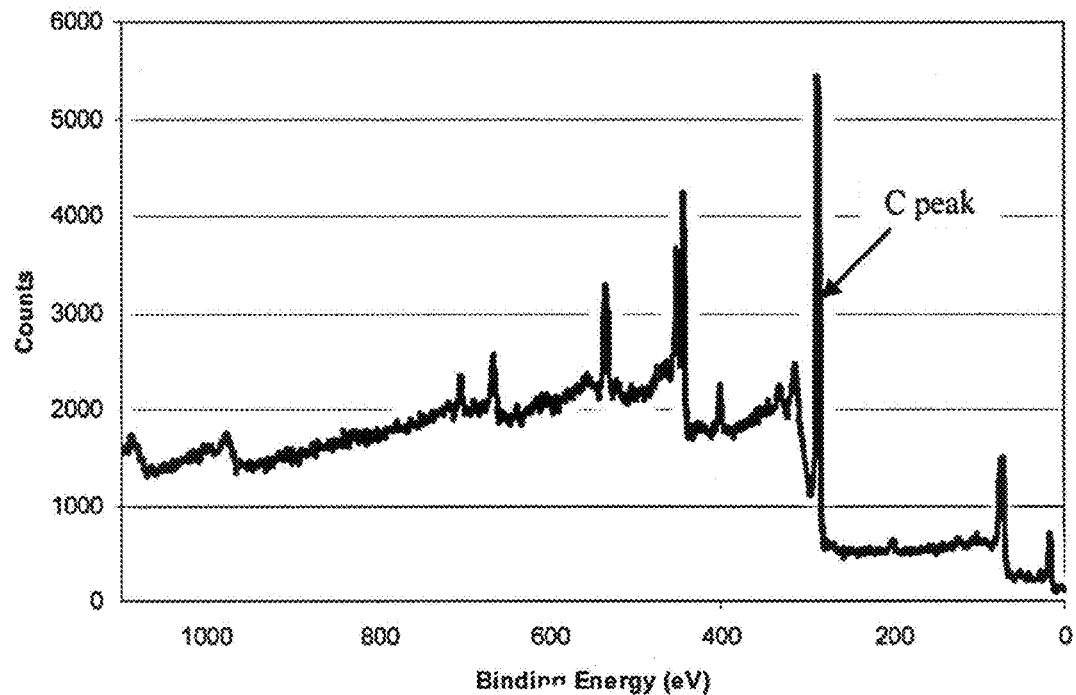
FIG. 6 is a survey XPS scans of an indium bump sample, post Ar/CH4/H2 plasma treatment.

FIG. 6 is a survey XPS scans of an indium bump sample, post Ar/CH4/H2 plasma treatment. Note the large carbon peak evident at 285 eV. While the large indium metal peaks in the high resolution XPS spectra peak suggest that a significant amount of the indium oxide has been removed, the presence of a large quantity of carbon (indicated in the survey XPS spectrum in FIG. 6) may have a negative effect on a hybridized device.

In accordance with the present invention a second plasma step, comprising an Ar/H2 mixture, is utilized to remove the hydrocarbon film left by the methane plasma. FIG. 5 shows that the addition of this second step does not alter the indium metal peak in the high resolution In 3d scan, but does dramatically reduce the carbon peak in the survey spectra.

Figure 7:
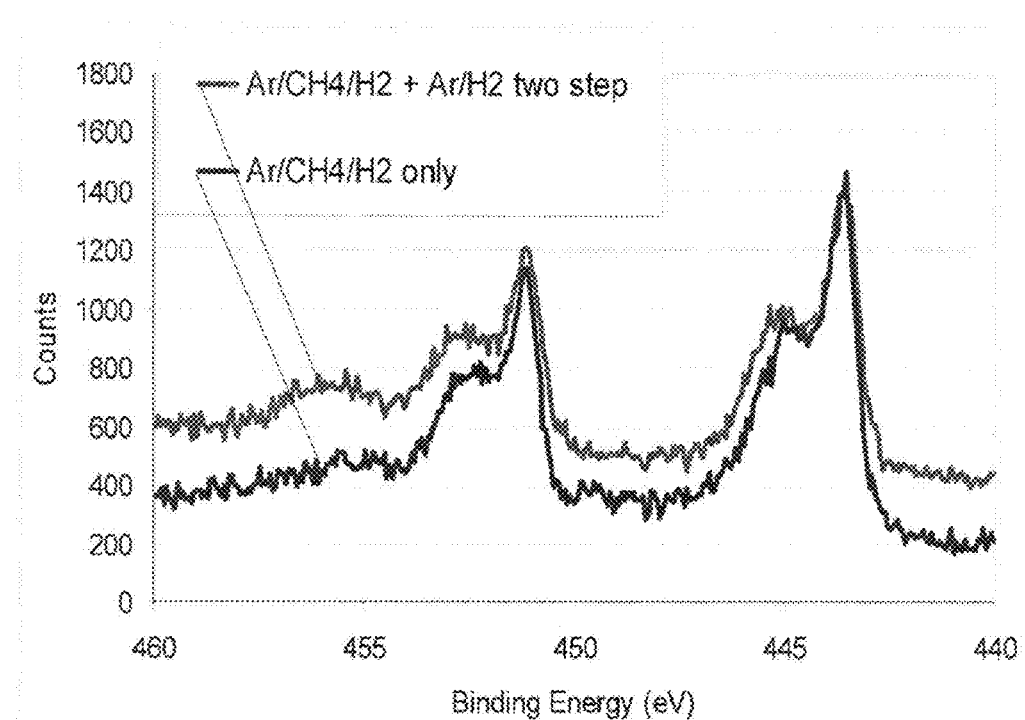
FIG. 7 is a composite graph of High resolution In 3d XPS scans of an indium bump sample.

FIG. 7 is a composite graph of High resolution In 3d XPS scans of an indium bump sample. Results are for two conditions: 1) post Ar/CH4/H2 plasma treatment and 2) post two step Ar/CH4/H2+Ar/H2 plasma treatments.

Figure 8:
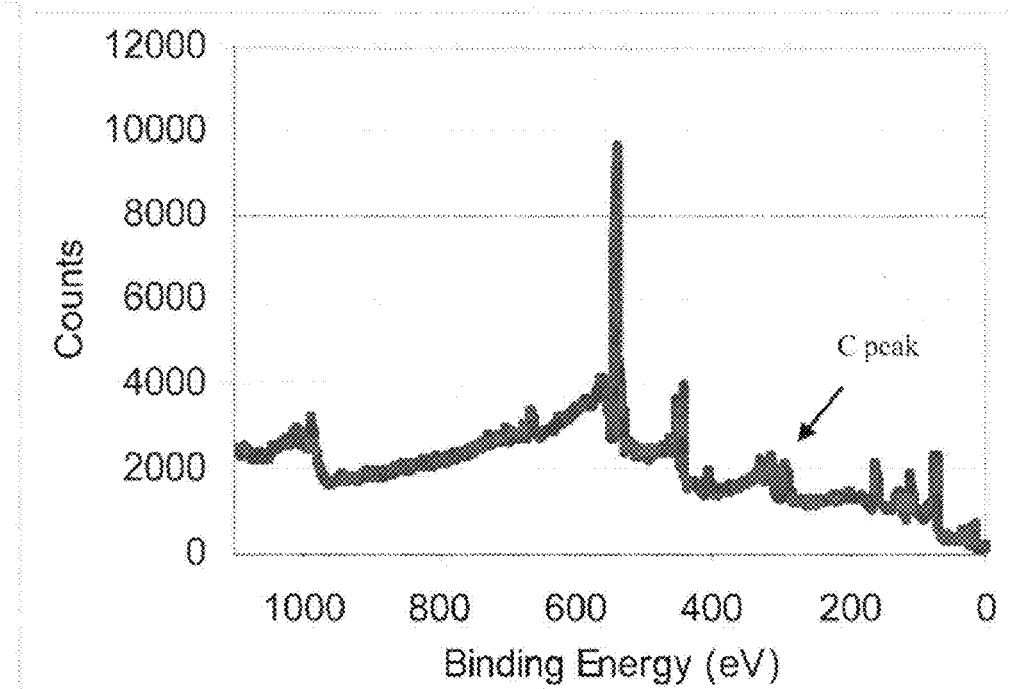
FIG. 8 is a survey XPS scan of an indium bump sample after the two step Ar/CH4/H2 and Ar/H2 plasma treatments.

FIG. 8 is a survey XPS scan of an indium bump sample after the two step Ar/CH4/H2 and Ar/H2 plasma treatments. Note the carbon peak at 285 eV is significantly smaller than in FIG. 6. The Ar/CH4/H2 plasma treatment removes a significant amount of the indium oxide but the methane plasma leaves a hydrocarbon film (as in FIG. 6), and so the Ar/H2 plasma is utilized to remove the hydrocarbon film left by the methane plasma.

Figure 9:
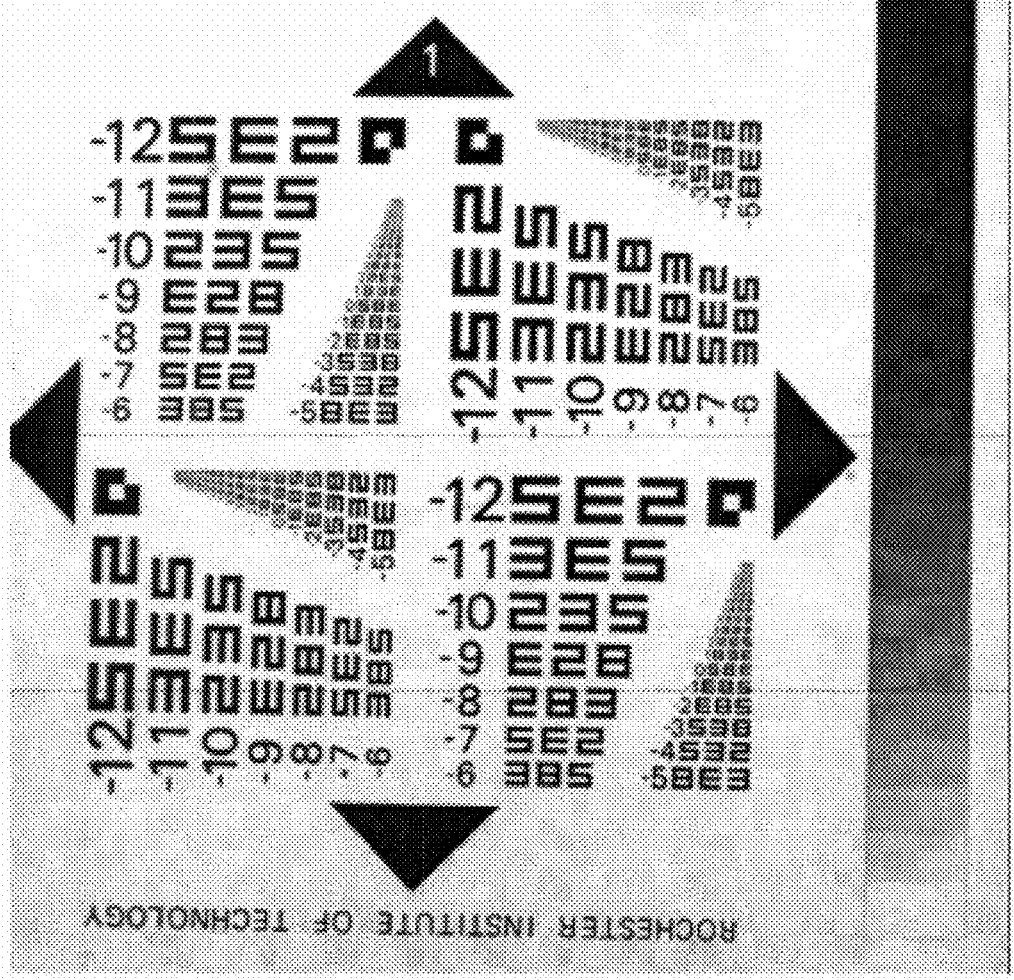
FIG. 9 is a test pattern imaged with a hybridized device having plasma cleaned bumps in accordance with the present invention.

FIG. 9 is a test pattern imaged with a hybridized device having plasma cleaned bumps in accordance with the present invention. The image was obtained at 80% of saturation for a hybridized detector. The image has been FPN-corrected to remove noise. The image shows that a hybridized device can be successfully fabricated using the above-described technique.

Figure 10:
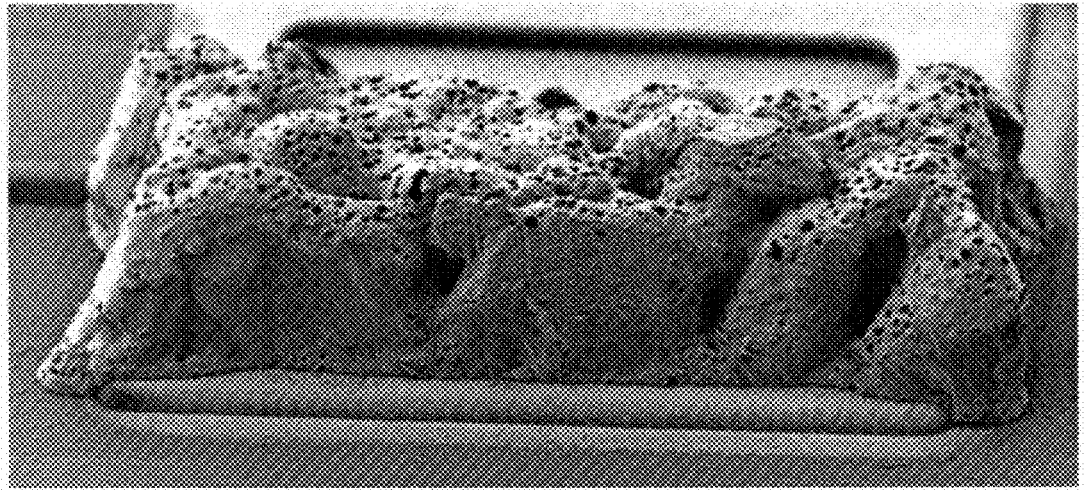
FIG. 10 shows an indium bump processed with the two step plasma treatment of the present invention using a relatively higher power in the Ar/H2 step.
Figure 11:
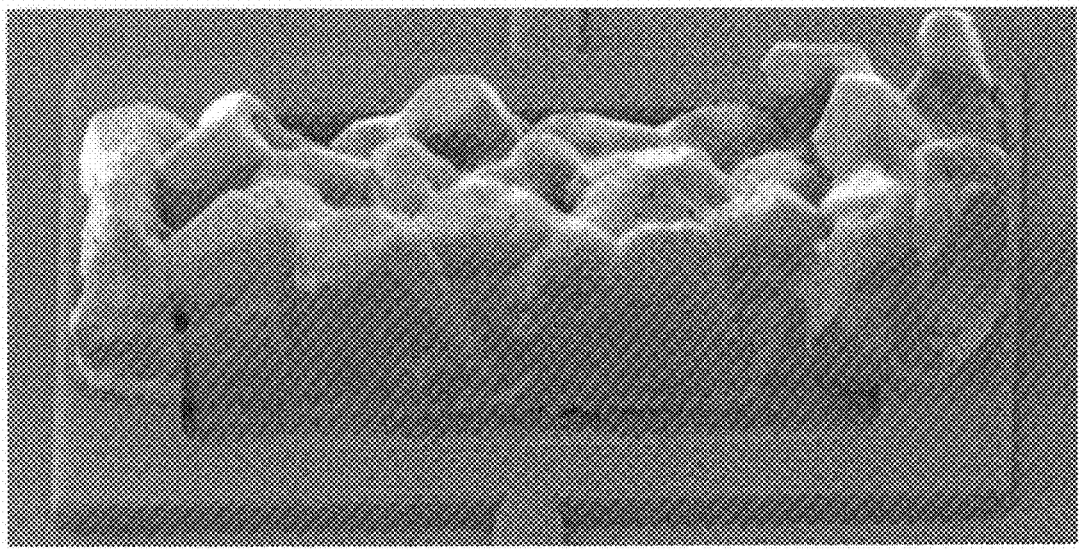
FIG. 11 shows an indium bump processed with the two step plasma treatment of the present invention.

To illustrate the importance of the preferred process parameters, both FIGS. 10 and 11 show an indium bump processed with the two step plasma treatment of the present invention, but FIG. 10 uses a relatively higher power in the Ar/H2 step, whereas FIG. 11 conforms to the critical process parameters of process pressure, plasma power, time, and process gas type, as stated above.

Immediately after plasma treatment the samples may be removed and placed in a high pressure bump bonder. The bonder should be pre-aligned to minimize the amount of air exposure of the treated samples prior to bonding.

It should now be apparent that the above-described process for removing indium oxide from the indium bumps is more effective in reducing the oxide, but does not require the use of halogens, does not change the bump morphology, does not attack the bond pad material or under-bump metallization layers, and creates no new mechanisms for open circuits.

Having now fully set forth the preferred embodiment and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth herein.

We claim:

1. A process for removing indium oxide from indium bumps in a flip-chip structure to reduce contact resistance, comprising the steps of:
    treating said indium bumps with a plasma of argon, methane, and hydrogen ($H_2$) to reduce indium oxide; and
    treating said flip chip with a plasma of argon and hydrogen to remove a hydrocarbon film resulting from the treating said indium bumps with the plasma of argon, methane, and hydrogen.

2. The process according to claim 1, wherein said plasma of argon, methane, and hydrogen comprises approximately equal parts argon, methane, and hydrogen.

3. The process according to claim 2, wherein said step of treating said indium bumps with the plasma of argon, methane, and hydrogen comprises treating said indium bumps for a time of approximately 20 minutes.

4. The process according to claim 2, wherein said step of treating said indium bumps with the plasma of argon, methane, and hydrogen comprises treating said indium bumps at a pressure of approximately 75 mTorr.

5. The process according to claim 2, wherein said step of treating said indium bumps with the plasma of argon, methane, and hydrogen comprises treating said indium bumps at a power of approximately 40 W.

6. The process of according to claim 1, wherein said plasma of argon and hydrogen comprises approximately 72% argon and approximately 28% hydrogen.

7. The process according to claim 6, wherein said step of treating said flip-chip with the plasma of argon and hydrogen comprises treating said flip-chip for a time of approximately 20 minutes.

8. The process according to claim 6, wherein said step of treating said flip-chip with the plasma of argon and hydrogen comprises treating said flip-chip at a pressure of approximately 80 mTorr.

9. The process according to claim 6, wherein said step of treating said flip-chip with the plasma of argon and hydrogen comprises treating said flip-chip at a power of approximately 40 W.

* * * * *